United States Patent [19]
Brooks et al.

[11] Patent Number: 5,628,121
[45] Date of Patent: May 13, 1997

[54] METHOD AND APPARATUS FOR MAINTAINING SENSITIVE ARTICLES IN A CONTAMINANT-FREE ENVIRONMENT

[75] Inventors: Ray G. Brooks; Timothy W. Brooks, both of Irving, Tex.

[73] Assignee: Convey, Inc., Euless, Tex.

[21] Appl. No.: 566,075

[22] Filed: Dec. 1, 1995

[51] Int. Cl.⁶ ................................................. F26B 19/00
[52] U.S. Cl. .................... 34/61; 34/68; 34/107; 34/187; 34/194; 34/195; 34/202; 34/227; 34/235; 414/416; 414/935; 141/93; 141/98
[58] Field of Search ................................. 34/60, 61, 68, 34/82, 107, 187, 194, 195, 202, 218, 227, 235; 134/DIG. 902; 414/225, 416, 935, 937, 941; 141/98, 93

[56] References Cited

U.S. PATENT DOCUMENTS

| | | | |
|---|---|---|---|
| 5,303,482 | 4/1994 | Yamashita et al. | 34/218 X |
| 5,320,218 | 6/1994 | Yamashita et al. | 414/935 X |
| 5,332,013 | 7/1994 | Sugita et al. | 141/98 |
| 5,351,415 | 10/1994 | Brooks et al. | 34/389 |
| 5,359,785 | 11/1994 | Fukutomi et al. | 34/60 |
| 5,363,867 | 11/1994 | Kawano et al. | 34/218 X |
| 5,482,161 | 1/1996 | Williams et al. | 141/98 X |

*Primary Examiner*—Henry A. Bennett
*Assistant Examiner*—Steve Gravini
*Attorney, Agent, or Firm*—Geoffrey A. Mantooth

[57] ABSTRACT

An apparatus and method for maintaining sensitive articles such as IC wafers or the like contaminant-free including a base member having a removable cover defining a sealed unit having an interior in which a plurality of sensitive articles are supported and through which a particle-free ionizing gas from a source on a wheeled table is continuously passed, the sealed unit being movable from a storage position on the table to an access position on associated processing without interruption of the ionized gas flow and at which the cover is removed and the supported articles continuously bathed with a particle-free, ionized gas to permit the articles to be sequentially moved to a fabricating position in the processing equipment and back to the access position while being continuously bathed with a particle-free ionized gas for subsequent assembly of the cover and base member and return of the sealed unit to the storage position.

12 Claims, 3 Drawing Sheets

METHOD AND APPARATUS FOR MAINTAINING SENSITIVE ARTICLES IN A CONTAMINANT-FREE ENVIRONMENT

FIELD OF THE INVENTION

This invention relates to the processing of sensitive articles without contamination and more particularly to a method and apparatus for maintaining IC wafers in a perfectly clean environment during storage, transfer and processing.

DESCRIPTION OF THE PRIOR ART

Rapidly developing technology in the field of contamination-sensitive articles such as semiconductor wafers has placed increasing demands on the elimination of contaminants. The increasing sensitivity of such wafers has made the presence of even infinitesimal contaminates a drawback to quality production and the elimination of rejects.

Myriad sources of such contaminates are always present. One source is in the form of ion contaminates from plastic boxes or cassettes in which the wafers are placed as well as people and equipment. Such ion contaminants migrate to wafer surfaces and can cause circuit degradation due to caustic and/or corrosive elements such as CL, PO4, NO3, NA and K found in polymeric material. When these polymeric material "outgas", these elements become mobile with environmental moisture and the rate of movement is dependent on charges on the wafer surfaces.

Other source is particulates found in clean rooms which are generated by people and equipment. Such particulates can be attracted to wafer surfaces (depending on unlike charges) where they cause circuitry degradation.

A further source is electrostatic charges generated by the motion of wafers, equipment, cassettes/boxes and people. Such electrostatic charges degrade the integrity of wafer circuitry due to uncontrolled electrostatic discharge (ESD).

Various proposals have been advanced to maintain an exceptionally clean environment for the fabrication of wafers. One of the earliest efforts was the provision of clean rooms with filtration (HEPA) and an ionization system. In such arrangements, the ionizing system is usually located near the ceiling so as not to interfere with personnel or equipment. As the work pieces in such rooms are more or less equidistant from the positive and negative high voltage emitters, buildup of unipolar charges are avoided. However, technology changes in wafer processing has led to the need for an even cleaner work environment which can be obtained by a reduction in the contaminate-free zone in which the work is carried out.

One prior effort in this direction is disclosed in U.S. Pat. No. 4,674,956, No. 4,532,970 and No. 4,534,389 wherein wafers are disposed in a portable airtight plastic box known as a "pod" that mechanically interfaces with an airtight canopy. However, use of this concept with clean room ionization systems results in the buildup of harmful static charges on the "pod" surfaces due to the proximity of the emitter points.

A more effective system is shown in U.S. Pat. No. 5,351,415 wherein an airtight transportable plastic container for wafers is disclosed. This container includes an inlet valve and an outlet valve which permit an ionizing gas to be continuously passed through the container at an intermediate stage in wafer processing and/or storage. With this arrangement, contamination of the wafers within the container from plastic "outgassing" or the like is avoided.

SUMMARY OF THE INVENTION

Accordingly, a primary object of this invention is to provide a new and novel method and apparatus for maintaining sensitive articles such as semiconductor wafers in an extremely clean environment during processing.

Another object of this invention is to provide a new and novel method and apparatus for maintaining IC wafers contamination-free before, during and after wafer processing.

A further object of this invention is to provide a new and novel method and apparatus for maintaining IC wafers contamination-free for prolonged periods including processing which utilizes existing equipment and containers with a minimum of modification.

Still another object of this invention is to provide a new and novel method and apparatus for maintaining semiconductor wafers contamination-free in a minimum environmental volume of ionizing gas during storage, transfer and fabrication.

A still further object of this invention is to provide a new and novel method and apparatus for moving IC wafers from storage to a process tool and back to storage in a contamination-free environment.

A further object of this invention is to provide a new and novel method and apparatus for maintaining IC wafers contamination-free during storage and fabrication using techniques which lend themselves to robotics.

Still another object of this invention is to provide a new and novel method and apparatus in which wafers stored in a contamination-free environment may be easily moved to a selected processing station without contamination.

The objects of the invention and other related objects are accomplished by the provision of a contamination-free sealed unit including a cover and a base member in which IC wafers are stacked and which is stored in a storage position on a movable table having a source of particle-free ionized gas. The unit includes an inlet and outlet to permit the gas to be passed into and out of the unit interior over the wafers. For wafer processing, the unit is transferred from the table without interruption of the gas flow to an access position on an associated process tool also having a source of particle-free ionized gas so that when the cover is removed, gas flows over the stacked wafers at the access position. From the access station, the wafers are sequentially moved to and from an appropriate work on the process tool with continuous bathing of the wafers during such movement with an ionized gas for subsequent replacement of the cover and return of the unit to the storage position so that the wafers are subjected to the ionized gas before, during and after the processing operations.

DESCRIPTION OF THE PREFERRED EMBODIMENT

Figure 1:
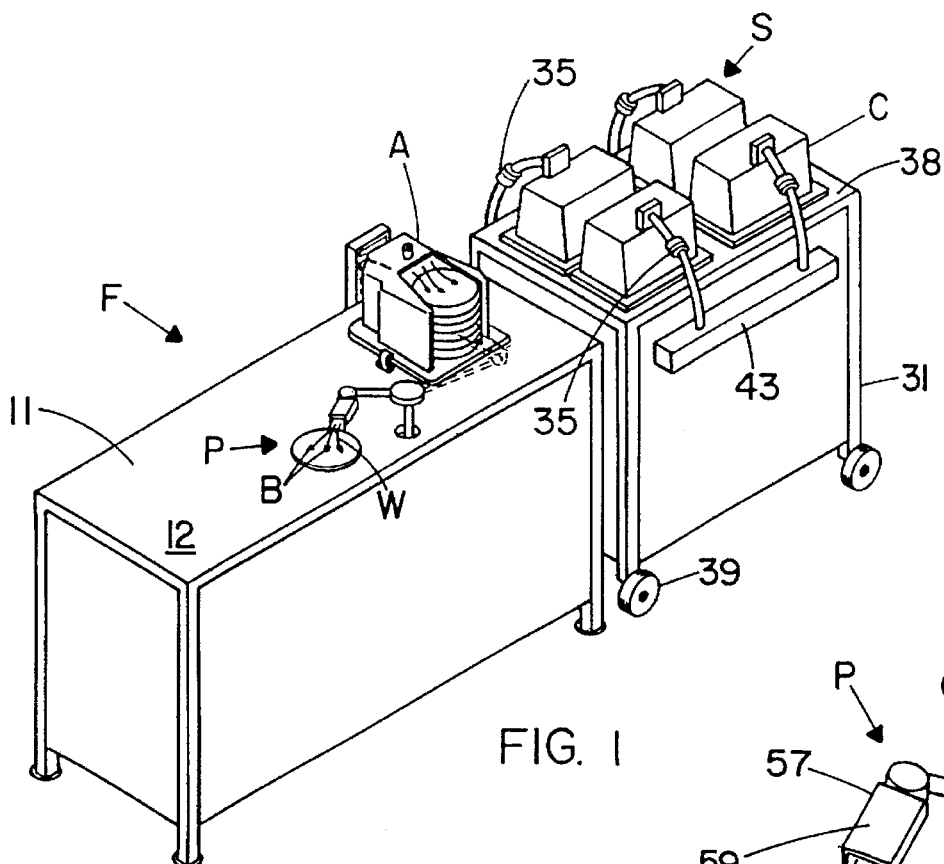
FIG. 1 is a perspective view of a wafer storage and processing system incorporating the method and apparatus of the invention.
Figure 2:
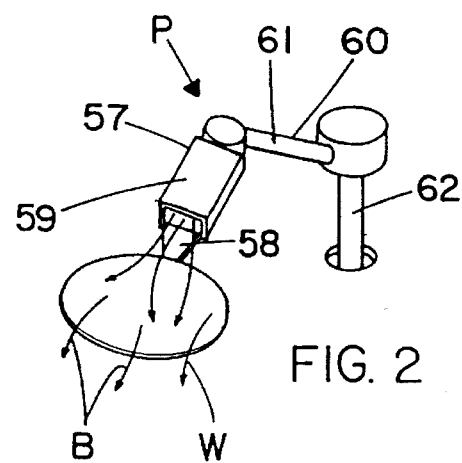
FIG. 2 is an enlarged perspective view of a portion of the wafer processing apparatus of FIG. 1.

Referring now to the drawings and to FIG. 1 in particular, there is shown a fabrication or processing installation for sensitive articles such as semiconductor wafers which incorporates the apparatus of the invention. The fabrication installation designated generally by the letter F in FIG. 1, includes a process tool 11 of conventional construction shown in the form of a work bench having a top or working surface 12. The process tool 11 is arranged to perform various well-known operations on wafers W at work stations on the tool 11, one of which is shown in FIG. 2 and designated generally by the letter P.

Figure 3:
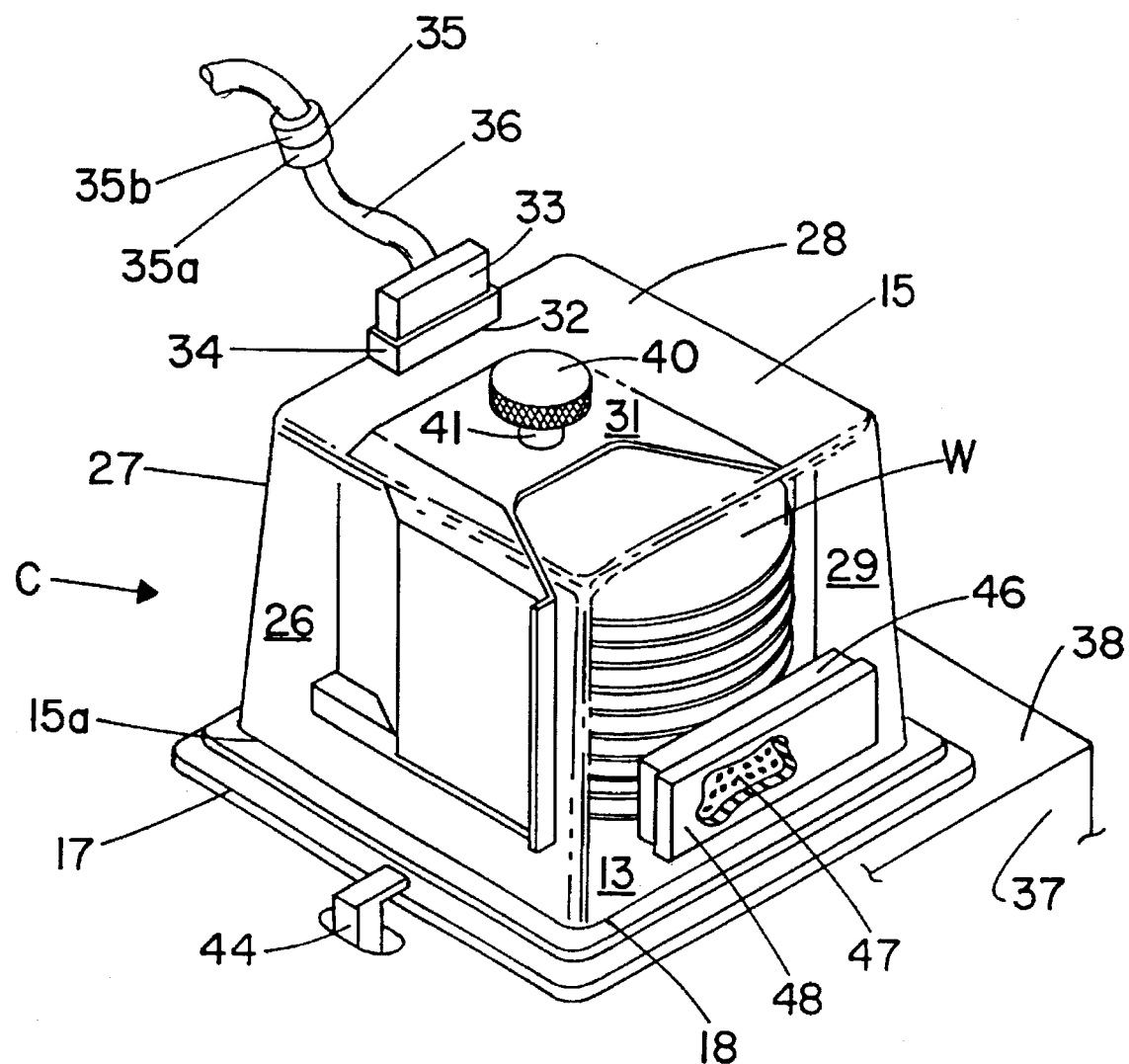
FIG. 3 is an enlarged perspective view of the wafer container incorporated in the apparatus of FIG. 1.

Referring now to FIG. 3, there is shown a container or sealed unit designated generally by the letter C in which wafers W to be processed are stored in a contamination-free environment. The container C is similar to that shown in the aforementioned U.S. Pat. No. 5,351,415 having an interior into which an ionized gas is introduced and exited therefrom to maintain the wafers in a contamination-free environment.

More specifically, the container C which is formed of a suitable plastic material includes a base member 14 and a cover 15 adapted for tight-fitting engagement to provide a sealed interior 13 as shown best in FIG. 3.

Figure 5:
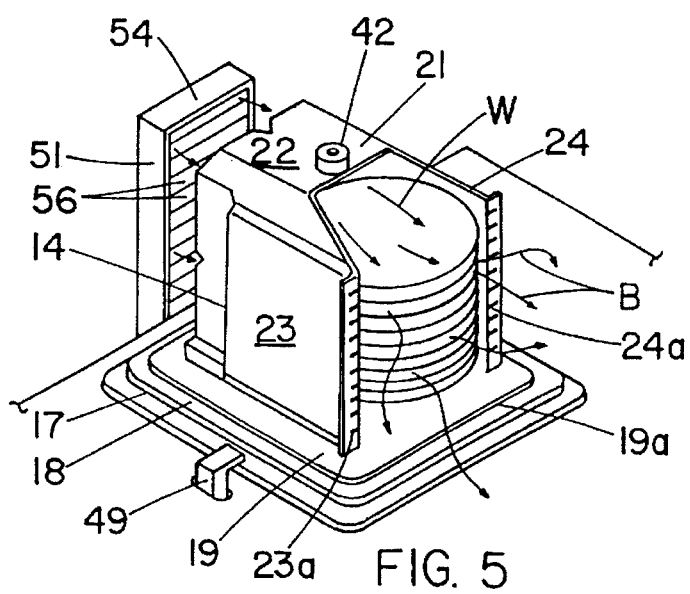
FIG. 5 is a perspective view of the base member of FIG. 4 in an access position during processing.

As shown best in FIG. 5, the base member 14 preferably includes a plurality of rectangular base plates 17–19 with the uppermost plate 19 having a peripheral edge 19a for sealing engagement with the lower peripheral edge 15a of the cover 15. Suitably secured to the upper surface of the base member 14 is an upright, U-shaped housing or boat 21 for supporting a plurality of wafers W in a stacked, vertically-spaced relationship as shown in FIG. 5. The boat 21 includes a top wall 22 and a pair of laterally spaced side walls 23, 24 having laterally aligned slots 23a, 24a respectively for receiving the wafers W. The boat 21 is therefore open at both ends.

The base member 14 and cover 15 are preferably molded of a suitable plastic material such as polypropylene. The cover 15 includes side walls 26–29 and a top wall 31 having an inlet 32 to the unit interior 13. The cover inlet 32 includes an inlet valve 33 and an ionizer 34 connected by means of a conduit 36 to a source of electric power and a source of gas such as air for processing by the ionizer 34.

Preferably, intermediate its ends, the conduit 36 is provided with a connector 35 of the type commonly referred to as a "quick-disconnect" having interengaging components 35a, 35b. Thus, in those situations where it is desirable to store a unit or container C for an indefinite period of time, the container C can be easily disconnected at the connector 35 with the purified interior 13 being maintained for a prolonged period.

Referring now again to FIG. 1, the sources of electric power and gas are preferably provided within an enclosure or table 37 generally referred to as a "purger table" having a top surface 38 and preferably provided with wheels 39 for wheeled movement on a supporting surface into a selected position adjacent the process tool 11.

The container cover 15 is releasably retained in the assembled position with the base member 14 by means of a suitable latch 40 which in the illustrated embodiment comprises a manually actuated rod 41 on the cover top wall 31 releasably engageable with a catch 42 on the top wall 22 of the boat 21.

A plurality of containers C may be positioned in a storage position identified by the letter S on the top 38 of the table 37, four of such containers being shown in the embodiment of FIG. 1. The conduits 36 of each of the containers C are connected to a source of gas (not shown) within the table 37 preferably by means of manifolds 43 and to the source of electric power through suitable conductors automatically by suitable switching means (not shown) when the cover 15 is positioned on the base member 14. Conversely, power and gas flow are interrupted when the cover 15 is removed from the base member 14.

In order to retain the containers C on the table top 38, releasable means such as spaced-apart latches 44 are provided table top which releasably engage opposite edges of the base member plate 17 as shown best in FIG. 3. These latches 44 are controlled by manually actuated switch means (not shown). The latches 44 may be moved between the position shown in FIG. 3 in gripping engagement with opposite edges of the base plate 17 of the base member 14 and a retracted position for releasing the base member 14.

During the time the containers C are held on the table top 38, ionized gas flows continuously through the container interior 13 to bath the wafers W stored therein and out of the container through an outlet 46 in the container cover 15 to maintain a contamination-free environment in the container interior 13. Preferably, the outlet 46 is provided with a filter 47 and a freely pivotal flap 48 is mounted on the outlet 46 over the filter.

To process the wafers W held within a container C, with the table 37 positioned as shown in FIG. 1, a sealed unit or container C is lifted from the table top 38 and moved into an access position identified by the letter A on the top surface 12 of the process tool 11. This movement is permitted by the flexibility of the conduit 36 and the flow of gas into the container interior 13 continues during such movement. The container C is retained in this access position by means of spaced-apart, releasable latches 49 which engage the edge portions of the base plate 17 similar to the latches 44. The latches 49 are also operated similarly to the latches 44 by suitable switch means (not shown).

Figure 4:
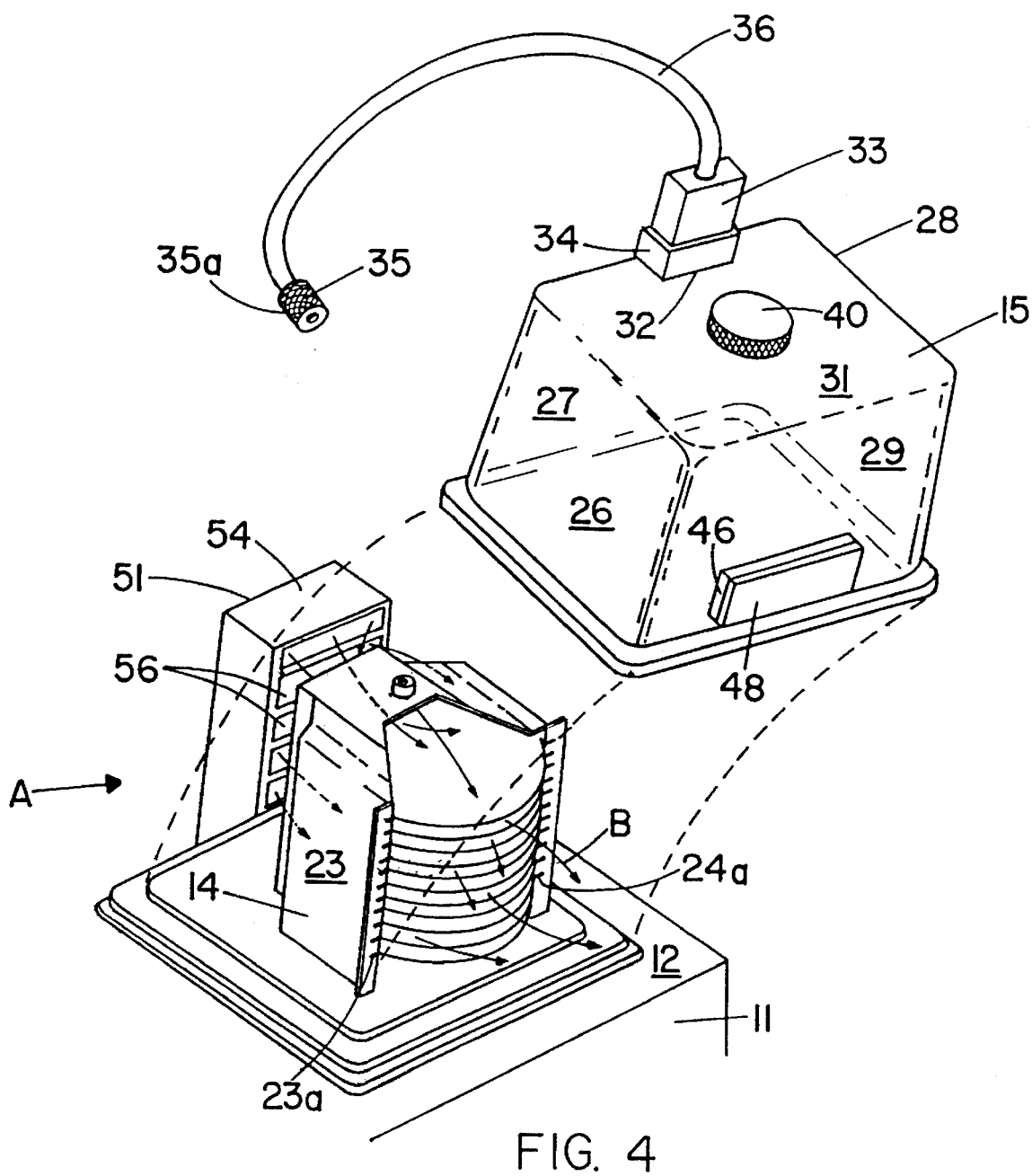
FIG. 4 is a perspective view of the container of FIG. 3 showing the cover and base member portions of the container in a separated condition.

As shown best in FIG. 5, the access position A on the work bench surface 12 is located adjacent a source of particle-free ionized gas suitably supported on the work bench 11. At the access position A, the cover 15 is removed from the base member 14 as shown best in FIG. 4 so that the open end at the rear of the boat 21 is exposed to the flow of gas in the direction of arrows B from the source 51. Removal of the cover 15 actuates suitable switch means for interrupting the gas flow through conduit 36.

The particle-free ionized gas source 51 includes an upstanding framework 54 having a plurality of louvers 56 for distributing the ionized gas therefrom over the wafers W in the direction of the arrows B. As can be seen, the ionized gas enters the rear end of the U-shaped housing or boat 21 and flows between the side walls 23, 24 over the wafers W thereby continuously maintaining the wafers W in a contamination-free environment until ready for processing.

In order to carry out the processing of the wafers W exposed at the access position A, a single wafer W is removed from the stack by a wand 57 as shown in FIG. 2 at the process station P. The wand 57 includes a vacuum pickup or spade 58 and an ionized gas spray 59 as described and claimed in U.S. Pat. No. 5,351,415-Brooks et al.

As the apparatus of the invention lends itself to robotics, the wand 57 is supported for reciprocating movement on a linkage 60 including an arm 61 and rotary shaft 62 for movement between the solid line and broken line positions of FIG. 1.

To move a wafer W from the stack contained in the boat 21 at access position A, the ionizer 59 and vacuum spade 58 are activated and the wand 57 moved through movement of the linkage 60 into the broken line position of FIG. 1 for gripping engagement with a wafer. The wafer W is then moved into the solid line position of FIGS. 1, 2 with ionizing gas flowing at all times over the wafer in the direction of the arrows H. As can be understood, the wafer W may be processed at successive process stations at all of which ionizing gas can be applied either continuously or intermittingly as desired for a contamination-free environment.

After completion of the fabrication processes on each of the wafers, the processed wafers are returned sequentially to the wafer stack at the access position A. Wafer return is accomplished by the linkage 60 with continuous actuation of the ionizer 59 as shown in broken lines in FIG. 1.

When the entire stack of wafers has been processed, the cover 15 is once again placed over the base member 14 in sealing engagement therewith and the flow of ionized gas into the container interior 13 resumed. Subsequently, the latch 49 is released and the container C returned to the storage position S on the table 37.

It is obvious that the physical components of the apparatus could be arranged in a variety of other configurations as long as base 14, wafer W within boat 21 and removable cover 15 are capable of operative association with process equipment 11.

Thus at all times, before, during and after wafer processing, the wafers W are subjected to the beneficial effect of a particle-free ionized gas to retain the wafers in a contamination-free environment.

We claim:

1. An apparatus for processing contaminant-sensitive substrate wafers comprising:

a base member for supporting one or more substrate wafers, a cover member removably supported on said base member, a sealed unit formed by said base member in a sealing relationship to said removably supporting cover member, a means for continuously passing a particle-free, ionized gas through said sealed unit for bathing said substrate wafers supported therein, a table capable of receiving said sealed unit in a latched position, a purger means on said table for continuously passing a particle-free, ionized gas through said base member while in a latched position and after said cover is removed from said sealed unit, a wand adjacent said table for removing a single substrate wafer from said base member, said wand having a means of continuously passing a particle-free, ionized gas over said single substrate wafer, said wand replacing said single substrate to said base member while continuously passing a particle-free, ionized gas over said single substrate wafer, a means for replacing said cover to said base unit and continuously passing a particle-free, ionized gas over said base and then continuously passing a particle-free, ionized gas through said sealed unit such that the ionized gas flow to the substrate wafers is uninterrupted.

2. Apparatus in accordance with claim 1 further comprising tool means for accommodating one or more of said sealed units, said tool means being adjacent to said table.

3. Apparatus in accordance with claim 2 including transport means on said table means for permitting movement of said table means into a selected position adjacent said tool means.

4. Apparatus in accordance with claim 3 wherein said table means include a table having wheels, a source of particle-free, ionized gas on said table and wherein said cover includes an inlet and outlet valve, flexible conduit means on said table for communicating said source of particle-free, ionized gas with said cover inlet valve whereby said particle-free, ionized gas is continuously introduced into said unit interior during the movement of said sealed unit from said table to said access position on said tool means.

5. Apparatus in accordance with claim 4 including a source of electric power on said table and wherein said source of particle-free, ionized gas includes an ionizer and means for connecting said ionizer to said source of electric power.

6. A process tool for fabricating contaminant-sensitive substrate wafers comprising:

a work surface, one or more process positions on said work surface for latching a base member containing substrate wafers in a vertically stacked, spaced-apart relationship, a plurality of louvers on said work surface for continuously passing a particle-free, ionized gas through said base member while in a latched position, a wand adjacent said work surface for removing a single substrate wafer from said base member while continuously passing a particle-free, ionized gas over said single substrate wafer.

7. In a process tool in accordance with claim 6 wherein said base member includes a substantially rectangular base plate having side edges and wherein said retaining means comprises a pair of spaced-apart latches for releasably engaging an adjacent side edge on said base plate.

8. A container for treating sensitive articles such as semiconductor wafers comprising:

a base member for containing substrate wafers in a vertically stacked, spaced-apart relationship, a cover adapted to fit over said base member, an inlet on said cover for continuously passing a particle-free, ionized gas through said base member and said cover, an outlet on said cover for continuously passing a particle-free, ionized gas from said base member and said cover, a catch on top of said base member for receiving a releasably engageable latch through a manually actuated rod from the top of said cover such that the catch and the latch provide a sealing engagement for said base member and said cover.

9. A container in accordance to claim 8 wherein said base member and said cover are formed of plastic material.

10. A container in accordance with claim 8 including an associated source of gas, an ionizer disposed in said cover inlet and a conduit for connecting said ionizer to said source of gas.

11. A container in accordance with claim 8 including releasable latch means on said cover and said base member for releasably retaining said cover on said base member in said sealing engagement.

12. A container in accordance with claim 8 including a filter in said cover outlet.

* * * * *